United States Patent [19]

Marconi

[11] 4,022,326
[45] May 10, 1977

[54] DUAL ACTION RETAINING GUIDE FOR PRINTED CIRCUIT CARD RACKS

[76] Inventor: Joseph Marconi, 428 Jensen Road, Vestal, N.Y. 13850

[22] Filed: Apr. 22, 1976

[21] Appl. No.: 679,237

[52] U.S. Cl. .............................. 211/41; 339/17 M; 361/399
[51] Int. Cl.² .......................................... H05K 5/02
[58] Field of Search ............ 211/41, 162, 184, 183; 339/17 L, 17 M, 17 LM, 65 R, 65 M, 66 R, 66 M; 317/101 D, 101 DH; 308/3 R, 3.6, 3.9; 312/332, 347, 183; 49/423, 428, 441, 451; 52/474, 494–502

[56] References Cited
UNITED STATES PATENTS

| | | | |
|---|---|---|---|
| 3,549,950 | 12/1970 | Shelden | 317/101 DH |
| 3,704,394 | 11/1972 | Johnson | 339/17 M X |
| 3,714,513 | 1/1973 | Marconi | 317/101 DH |
| 3,715,629 | 2/1973 | Swengel, Sr. | 317/101 R |

FOREIGN PATENTS OR APPLICATIONS 1,109,701  4/1968  United Kingdom ........ 317/101 DH

OTHER PUBLICATIONS

IBM Technical Disclosure Bulletin, vol. 17, No. 1, 6–1974, p. 128 "Circuit Board Support", K. L. Manns.
Product Engineering Publication — June 10, 1963, pp. 96–97, "8 More Printed Circuit Guides", Schuster.

Primary Examiner—Roy D. Frazier
Assistant Examiner—Terrell P. Lewis
Attorney, Agent, or Firm—Frederick E. Bartholy

[57] ABSTRACT

A retaining guide for printed circuit cards has the form of a narrow channel member having a bottom wall and vertically-extending side walls.

The cards are slidably inserted into this member. The retentive force is exerted upon the cards by the fact that the channel member has a non-linear, undulating configuration as well as a plurality of spaced inwardly-extending contact surfaces of the side walls thereof.

2 Claims, 4 Drawing Figures

DUAL ACTION RETAINING GUIDE FOR PRINTED CIRCUIT CARD RACKS

FIELD OF THE INVENTION

This invention relates to retaining guides for printed circuit cards which are mounted on racks, which, in the form of a cage, accommodate a plurality of cards in spaced relationship.

In the present state of electronic technology, components of a circuit are mounted on flat plates of an insulated material which have a conductive backing. The latter is cut out or etched to present conductive paths of predetermined configuration, whereby the various components are interconnected in accordance with a schematic circuit. Such plates are generally known as printed circuit cards or boards.

The circuits presented by a number of cards are generally interconnected by suitable terminal sockets of the plug-in type into which the connectors of the cards may easily be inserted. Thus the purpose of the rack is to provide a frame or cage for retaining guides which accommodate the cards and to serve as a support for the terminal sockets. The retainers for the cards are in most cases of channel-type construction for slidably supporting the cards.

It is manifestly of great advantage if the retainers allow easy insertion and removal of the cards and, at the same time, provide a firm hold.

DESCRIPTION OF THE PRIOR ART

The retainers of printed circuit cards generally consists of narrow, linear channel-type structures. While such channel members may provide a firm hold on the cards, the problem arises as to what extent such hold shall be maintained. Manifestly, if the hold against the card surface is strong, it prevents easy sliding of the card in and out of the channel member and, vice versa, if easy sliding is to be maintained, and this is a desirable requirement, then the hold on the card will not be sufficiently reliable.

Attempts have been made to utilize retainers made of plastic material which improves the condition of slidability, However, plastic members, generally molded, are by no means sturdy and often, upon insertion of a panel, breakage occurs. This, of course, requires disassembly of the rack in order to install a new retainer. Not only is this a tedious procedure, but it entails the shutting down of the entire assembly as far as its electrical function is concerned. In addition, grip-type plastic retainers must be wide in order to accommodate, at the bottom, the resilient gripping members which engage the card. This requires much wider channel members which, of course, limits the number of cards one may place in the rack. Moreover, such retainers restrict the air flow which is important for adequate cooling of the components.

Retainers for printed circuit cards in such form as to be strong, yet resilient, and to provide a holding force allowing easy removal yet firm support has been the object of various patents of the prior art. The most common form utilizes rectilinear channel members having a gripping action directed towards the side of the cards. These are exemplified by U.S. Pat. Nos. 3,349,924; 3,549,950; and 3,563,391.

Edge contact with some lateral guiding is shown in U.S. Pat. Nos. 3,696,936 and 3,465,891. The edge contacts are generally in the form of spring members which are depressed upon insertion of the card. This dual hold requires careful tolerances of pressure in order to avoid overclamping of the cards.

A unique approach is represented by applicant's U.S. Pat. No. 3,714,513 where an arcuate channel member is rectilinearly distorted by the insertion of a card, thus producing a firm hold with ease of insertion or removal.

SUMMARY OF THE INVENTION

It is the primary object of this invention to provide retaining members for printed circuit cards adapted to be mounted on a rack which, while of the sliding type, exert a force solely on the marginal side of the card and thereby allow easy removal or insertion of such cards.

It is a distinct feature of the invention that the channel members are non-linear, having an undulating configuration, thus contact the side of the card at selected points, depending upon the radius of deformation.

It is a particular advantage of the invention that the retaining guide may have a dual function, depending upon the flexibility of the card and stiffness of the guide members.

Other objects, features and advantages will be apparent from the following description of the invention, pointed out in particularity in the appended claims, and taken in connection with the accompanying drawing, in which:

Prior to referring to the figures, it is to be pointed out that the invention contemplates a dual action retaining guide, namely, one which is sufficiently flexible, made from metal or plastic, in the form of a channel member which has an undulatory configuration subject to linear distortion by the inserted card. In this manner, a laterally exerted retentive force is produced which holds the card firmly in place.

The second action of a guide of the above construction, but made of a more rigid material, constrains the inserted card to bend and follow the wavy pattern of the channel member. By virtue of the shape of the guide, a firm lateral pressure is exerted on the card.

Needless to say, the choice between the above types of channel members depends on the cards to be used. For short cards, about 4 inches in length, the more flexible type of retaining guide would be used, whereas for long cards, exceeding 4 inches, the stiffer channel member may be selected.

Printed circuit cards used in industry are made of plastic material having a certain degree of flexibility. The thickness of such cards is approximately 1/16 of an inch. Obviously, short cards would require the use of the flexible type of channel members, whereas long cards may be used effectively with the more rigid members.

Figure 1:
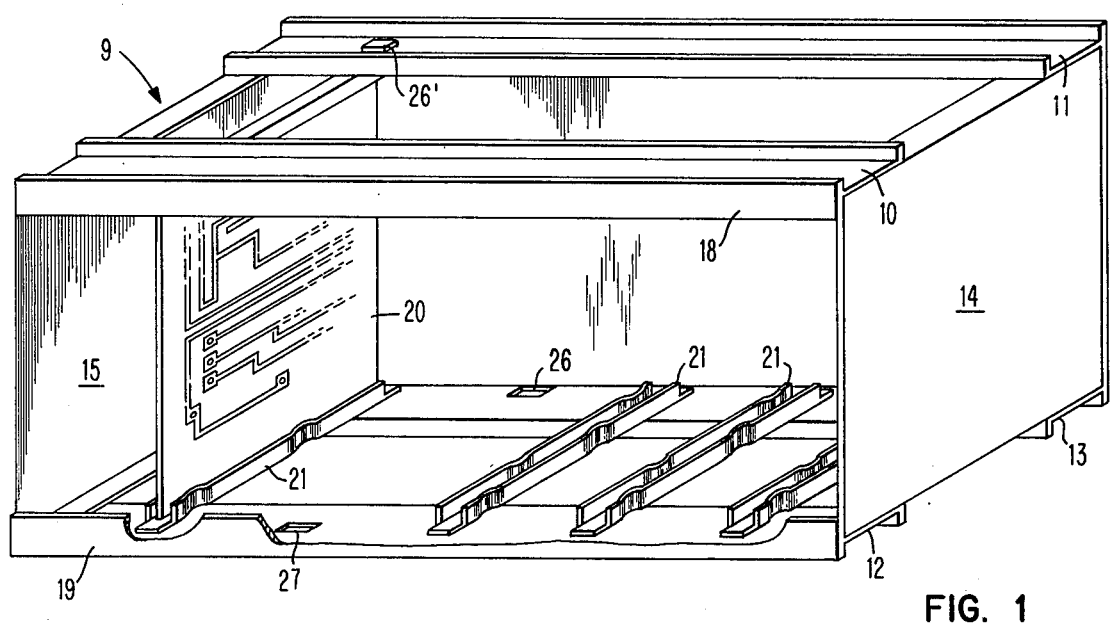
FIG. 1 is a rear view in perspective of a printed circuit card rack constructed in accordance with the invention.

Referring to the figures, it is seen in FIG. 1 that the rack 9 presents a frame of oblong configuration, consisting of parallel support members 10, 11, 12 and 13 which are joined to end plates 14 and 15. Support members 10 and 12 have inwardly extending sides 18 and 19, respectively, the purpose of which, as will be understood later, is to act as an abutting wall for the circuit card 20. Consequently, the illustration in FIG. 1 is a rear view of the rack 9. The latter accommodates a plurality of card retainers 21 in spaced relationship.

For the sake of simplifying the drawing, only two retainers are shown in detail. Any number and variety of these may be used, depending upon the size of the rack 9 and, of course, the choice of the designer. The retainers 21 are placed between the support members 10 and 11, and 12 and 13, respectively. The distance between the placement of the retainers depends upon the component elements of circuit card 20. Sufficient space must be provided so that each card 20 may be easily inserted between oppositely placed retainers.

Figure 2:
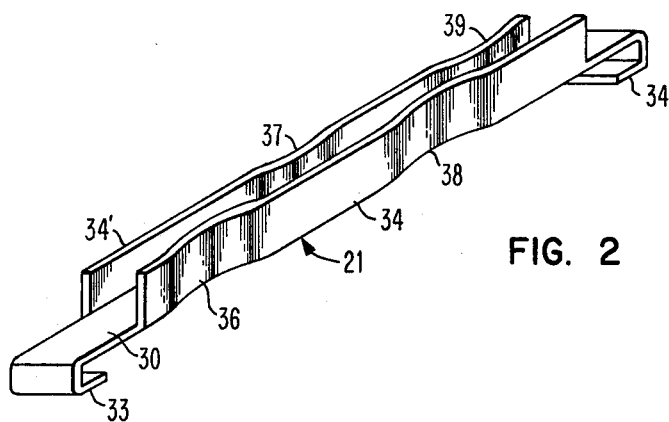
FIG. 2 is a perspective view of the channel member, illustrating the undulatory shape thereof and the spaced inwardly-extending contact surfaces.

Now let us consider the constructional features of the retaining guide 21 as shown in FIG. 2. It is seen that it has a bottom wall 30 turned in at both ends to form hooks 33 and 34 which fit into the slots 26 and 27 of support members 12 and 13 when located at the bottom of the rack 9, and in similar slots in the support members 10 and 11 when located on the top of the rack 9. In the perspective presentation of FIG. 1, the slots on the top portion cannot be seen except for the one indicated as 26′.

As can be seen in FIG. 2, the retaining guide has side walls 34 and 34′ perpendicular to the bottom wall 30. The latter has an undulatory configuration. In addition, by virture of the undulatory shape of the member, the side walls form inwardly-extending semi-circular contact surface 36, 37, 38 and 39 spaced apart in such manner that each of these surfaces faces a smooth portion of the opposing wall. The resultant structure, as will be seen, plays an important part in retaining the printed circuit card when inserted between vertically aligned guide members.

Figure 4:
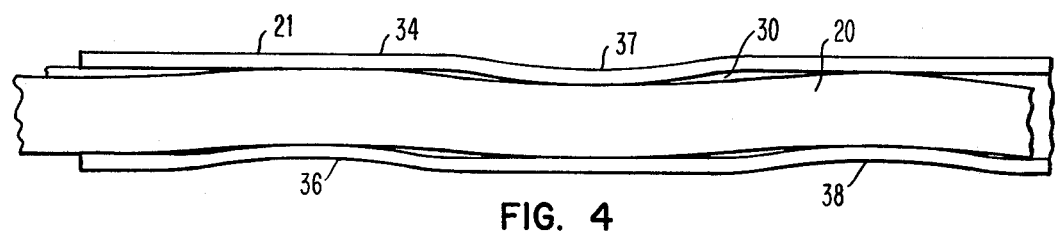
FIG. 4 is a view similar to that of FIG. 3, wherein the channel member is rigid, constraining the inserted card to bend and follow the configuration of the member.
Figure 3:
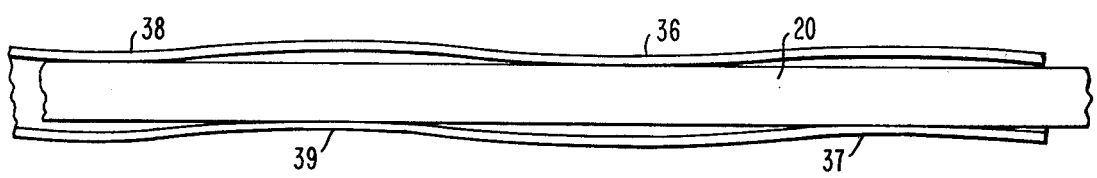
FIG. 3 is an enlarged partial top view of a channel member such as the one in FIG. 2 with a card inserted, wherein the member is flexible, permitting distortion thereof by the inserted card.

FIGS. 3 and 4 are enlarged, partial views, looking down on the retaining guide 21 to illustrate the holding action when a card is inserted.

As mentioned before, the invention contemplates two types of retaining guides — one in which the guide structure is elastic, in that the walls of the guide are flexible so that upon insertion of a card, lateral distortion of the walls exert the retentive force. This is illustrated in FIG. 3. The second type of retaining guide is of heavier gauge and of such solid material which retains its shape upon insertion of a card. In this type of application, the card is constrained to follow the undulatory shape of the channel member and thus is held by the gripping action of the side walls. This is illustrated in FIG. 4.

It is to be understood that the flexibility of the type of guide members shown in FIG. 3 is such that it will accommodate standard thicknesses of cards used in industrial applications. The guide may be completely flattened out by a card as far as the lateral semi-circular contact surfaces 36, 37, 38 and 39 are concerned. These are the important lateral pressure elements, their action being enhanced by the undulatory shape of the guide itself.

As far as the guide member of which the action is shown in FIG. 4 are concerned, the material used to obtain the required rigidity is a matter of choice, depending upon the engineering design based on standard practice in this field.

By mixing the two types of guide members in one cage, it is feasible to accommodate standard printed circuit cards of various lengths in a single rack.

The invention in its broader aspects is not limited to the specific embodiments herein shown and described but changes may be made within the scope of the accompanying claims without departing from the principles of the invention and without sacrificing its chief advantages.

What is claimed is :

1. A retaining guide for printed circuit cards comprising an elongated channel member having a bottom wall and side walls vertically extending therefrom, said member having a non-linear undulating configuration, said side walls of said channel member defining inwardly-extending semi-circular contact surfaces in alternating spaced relationship with respect to opposing walls, said contact surfaces being so proportioned as to engage the sides of a circuit card, thereby exerting a retentive force.

2. A channel member in accordance with claim 1 wherein said contact surfaces and the bottom wall are of a substance sufficiently rigid with respect to the flexibility of said card as to constrain said card to distort in following the configuration of said channel member.

* * * * *